United States Patent
Teshigahara et al.

(10) Patent No.: US 12,336,434 B2
(45) Date of Patent: Jun. 17, 2025

(54) PIEZOELECTRIC FILM LAYERED STRUCTURE AND METHOD FOR PRODUCING THEREOF

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Akihiko Teshigahara, Nisshin (JP); Tetsuya Enomoto, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 849 days.

(21) Appl. No.: 17/555,607

(22) Filed: Dec. 20, 2021

(65) Prior Publication Data
US 2022/0246833 A1 Aug. 4, 2022

(30) Foreign Application Priority Data
Feb. 2, 2021 (JP) ................................ 2021-015022

(51) Int. Cl.
  *H10N 30/853* (2023.01)
  *H10N 30/093* (2023.01)
(52) U.S. Cl.
  CPC ......... *H10N 30/853* (2023.02); *H10N 30/093* (2023.02)

(58) Field of Classification Search
  CPC .. H10N 30/853; H10N 30/093; H10N 30/704; H10N 30/076; H10N 30/308; H10N 30/50
  See application file for complete search history.

(56) References Cited

U.S. PATENT DOCUMENTS

| | | | |
|---|---|---|---|
| 8,896,187 B2 * | 11/2014 | Suenaga | H10N 30/076 252/62.9 PZ |
| 2008/0296529 A1 * | 12/2008 | Akiyama | H10N 30/306 252/62.9 PZ |
| 2012/0107557 A1 | 5/2012 | Akiyama et al. | |
| 2017/0309811 A1 | 10/2017 | Yamamoto et al. | |
| 2019/0326880 A1 | 10/2019 | Figueredo et al. | |

(Continued)

FOREIGN PATENT DOCUMENTS

JP 2001253778 A 9/2001

OTHER PUBLICATIONS

Clement, Marta, et al. "Effects of post-deposition vacuum annealing on the piezoelectric properties of AlScN thin films sputtered on 200 mm production wafers", In: 2018 IEEE International Ultrasonics Symposium (IUS). IEEE, 2018. S. 1-4.

(Continued)

*Primary Examiner* — Emily P Pham
(74) *Attorney, Agent, or Firm* — Posz Law Group, PLC

(57) ABSTRACT

A piezoelectric film layered structure includes a base, and a ScAlN film formed on the base. The ScAlN film has an unpaired electron density within a range between $1.7 \times 10^{18}$ electrons/cm$^3$, inclusive, and $1.1 \times 10^{19}$ electrons/cm$^3$, inclusive.

5 Claims, 5 Drawing Sheets

(56) References Cited

U.S. PATENT DOCUMENTS

2020/0357976 A1  11/2020  Teshigahara et al.

OTHER PUBLICATIONS

Fichtner et al., "Identifying and overcoming the interface originating c-axis instability in highly Sc enhanced AlN for piezoelectric micro-electromechanical systems", Journal of Applied Physics, 122, (Jul. 1, 2017).
Bittner et al., "High temperature stability of $Sc_xAl_{1-x}N$ (x=0.27) thin films", Proceedings of SPIE 9517, Smart Sensors, Actuators, and MEMS VII; and Cyber Physical Systems, 95171C (May 21, 2015).
Fichtner et al., "Stress controlled pulsed direct current co-sputtered $Al_{1-x}Sc_xN$ as piezoelectric phase for micromechanical sensor applications", Apl Materials 3, 116102 (Nov. 3, 2015).
Wingqvist et al., "Increased electromechanical coupling in w-$Sc_xAl_{1-x}N$" Applied Physics Letters 97, 112902 (Sep. 14, 2010).
Ali et al., "Piezoelectric MEMS based acoustic sensors: A review" Sensors and Actuators A: Physical 301 ScienceDirect 111756 (Jan. 1, 2020).

\* cited by examiner

PIEZOELECTRIC FILM LAYERED STRUCTURE AND METHOD FOR PRODUCING THEREOF

CROSS REFERENCE TO RELATED APPLICATION

This application is based on Japanese Patent Application No. 2021-015022 filed on Feb. 2, 2021, the disclosure of which is incorporated herein by reference in its entirety.

TECHNICAL FIELD

The present disclosure relates to a piezoelectric film layered structure in which a piezoelectric film and a base are layered, and a method for producing the same.

BACKGROUND

A piezoelectric film layered structure includes a base and a scandium-containing aluminum nitride (ScAlN) film that is a piezoelectric film.

SUMMARY

A piezoelectric film layered structure includes a base and a scandium-containing aluminum nitride (ScAlN) film formed on the base. The ScAlN film has an unpaired electron density within a range between $1.7 \times 10^{18}$ electrons/cm$^3$, inclusive, and $1.1 \times 10^{19}$ electrons/cm$^3$, inclusive.

A method for producing a piezoelectric film layered structure includes forming a ScAlN film on a base at a first temperature and annealing the ScAlN film by heating the ScAlN film at a second temperature higher than the first temperature such that the ScAlN film has an unpaired electron density within a range between $1.7 \times 10^{18}$ electrons/cm$^3$, inclusive, and $1.1 \times 10^{19}$ electrons/cm$^3$, inclusive.

DESCRIPTION OF EMBODIMENTS

To begin with, examples of relevant techniques will be described.

A piezoelectric film layered structure includes a base and a scandium-containing aluminum nitride (ScAlN) film that is a piezoelectric film. The ScAlN film has a higher piezoelectricity than an AlN film. Thus, the piezoelectric film layered structure provided with the ScAlN film is expected to be applied to various devices.

When the piezoelectric film layered structure provided with the ScAlN film is applied to various devices, it is desirable that the ScAlN film have low tan δ. The tan δ is one of electrical characteristics called a dielectric loss tangent. More specifically, the tan δ is a numerical value indicating a degree of a loss of electric energy as a heat in a dielectric when an AC electric field is applied to the dielectric.

In view of the above points, it is an objective of the present disclosure to provide a piezoelectric film layered structure that has a ScAlN film having a low tan δ and a method for producing the same.

A piezoelectric film layered structure includes a base and a scandium-containing aluminum nitride (ScAlN) film formed on the base. The ScAlN film has an unpaired electron density within a range between $1.7 \times 10^{18}$ electrons/cm$^3$, inclusive, and $1.1 \times 10^{19}$ electrons/cm$^3$, inclusive.

A method for producing a piezoelectric film layered structure includes forming a ScAlN film on a base at a first temperature and annealing the ScAlN film by heating the ScAlN film at a second temperature higher than the first temperature such that the ScAlN film has an unpaired electron density within a range between $1.7 \times 10^{18}$ electrons/cm$^3$, inclusive, and $1.1 \times 10^{19}$ electrons/cm$^3$, inclusive.

Here, the present inventors have found that a controlling factor of tan δ of the ScAlN film is unpaired electron density and the tan δ of the ScAlN film can be lowered by setting the unpaired electron density of the ScAlN film to be a value within a range between $1.7 \times 10^{18}$ electrons/cm$^3$, inclusive, and $1.1 \times 10^{19}$ electrons/cm$^3$, inclusive.

Thus, according to one aspect of the present disclosure, a piezoelectric film layered structure including the ScAlN film that has a low tan δ can be obtained. According to another aspect of the present disclosure, a method for producing a piezoelectric film layered structure including a ScAlN film that has a low tan δ is provided.

Hereinafter, embodiments of the present disclosure will be described with reference to the drawings. In the following embodiments, the same or equivalent parts are denoted by the same reference signs.

First Embodiment

Figure 1:
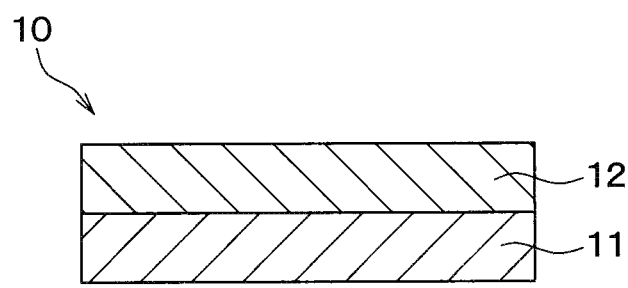
FIG. 1 is a cross-sectional view of a piezoelectric film layered structure according to a first embodiment.

As shown in FIG. 1, a piezoelectric film layered structure 10 of the present embodiment includes a base 11 and a scandium-containing aluminum nitride (ScAlN) film 12. The base 11 and the ScAlN film 12 are layered.

The base 11 is used as a foundation for the ScAlN film 12. The base 11 is in contact with the ScAlN film 12 and supports the ScAlN film 12. As a material forming the base 11, an electrode material or a material other than the electrode material is used. Examples of the electrode material include semiconductor materials, metal materials, conductive ceramic materials, and the like.

Examples of the semiconductor material forming the base 11 include silicon (Si). That is, a silicon substrate can be used as the base 11. When the silicone substrate is used, a specific electrical resistance of the silicon substrate is arbitrarily set depending on applications.

As the metal material forming the base 11, it is preferable to use a metal material whose crystallinity is not change during annealing in a production of the piezoelectric film layered structure 10, which will be described later. That is, it is preferable to use a metal material having high melting temperature. Further, as the metal material forming the base 11, it is preferable to use a metal material that is often used in semiconductor processes including micro electro mechanical systems (MEMS). Examples of the metal material satisfying such requirements include Mo, Ti, Pt, Ru and the like.

Examples of the conductive ceramic material forming the base 11 include titanium compounds such as titanium nitride (TiN). TiN is often used as an electrode material in semiconductor processes.

The base 11 is not limited to a single member, and may be multiple members. That is, the ScAlN film 12 may be formed on the multiple members as the base 11.

The ScAlN film 12 is a piezoelectric film made of ScAlN (that is, scandium-containing aluminum nitride). The ScAlN film 12 is formed on the surface of the base 11.

The scandium concentration (Sc concentration) of the ScAlN film 12 may be any concentration within a range between 0 atomic %, inclusive, and 45 atomic %, inclusive. The Sc concentration is a proportion of the number of scandium atoms in the total number of the scandium atoms and aluminum atoms as 100 atomic %. Atomic % refers to atomic percent. The Sc concentration is measured by RBS. RBS is an abbreviation for Rutherford Backscattering Spectrometry. The Sc concentration shown in the present specification is a value measured under the following measurement conditions using the following device.

Device name: Pelletron 3SDH manufactured by National Electrostatics Corporation
Measurement conditions
RBS measurement
Incident ion: 4He++
Incident energy: 2300 keV
Incident angle: 0 deg
Scattering angle: 160 deg
Sample current: 13 nA
Beam diameter: 2 mmφ
In-plane rotation: None
Irradiation: 70 µC The unpaired electron density of the ScAlN film 12 falls within a range between $1.7\times10^{18}$ electrons/cm$^3$, inclusive, and $1.1\times10^{19}$ electrons/cm$^3$, inclusive. The unpaired electron density is also called dangling bond density or electron spin density. The unpaired electron density is measured by electron spin resonance method. The unpaired electron density of the ScAlN film 12 shown in the present specification is a value measured under the following measurement conditions using the following ESR device. ESR is an abbreviation for Electron Spin Resonance.

Device name: Elexsys E580 manufactured by BRUKER
Attached device: ER036TM Gauss meter manufactured by BRUKER
Measurement conditions
Measurement temperature: 20 K
Central magnetic field: Near 3362 G
Magnetic field sweep range: 1000 G
Modulation: 100 kHz, 5 G
Microwave: 9.42 GHz, 0.01 mW
Sweep time: 167.77 s×4 times
Time constant: 327.68 ms
Data Point: 2048 points
Cavity: super-high-Q For example, an upper electrode may be present on the upper surface of the ScAlN film 12 that is a target of the electron spin density measurement. Further, a lower electrode may be present on the lower surface of the ScAlN film 12 that is the target of the electron spin density measurement, and a substrate may be present on the lower surface of the lower electrode. In this case, it is difficult to measure an electron spin density of the ScAlN film 12 in the presence of the upper electrode or the lower electrode.

Thus, when the upper electrode is present, the upper electrode is removed by etching or the like. This makes it possible to measure the electron spin density. When the lower electrode and the substrate are present on the lower surface of the ScAlN film, the upper surface of the ScAlN film is fixed to other substrate and the substrate located on the lower surface of the ScAlN film is removed by machining or etching. Further, the lower electrode is removed by etching. This makes it possible to measure the electron spin density.

Figure 2:
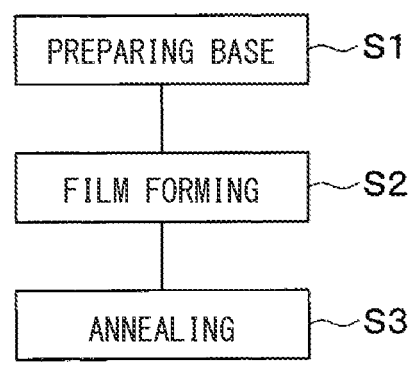
FIG. 2 is a flowchart illustrating a procedure of forming the piezoelectric film layered structure according to the first embodiment.

Next, a method for producing the piezoelectric film layered structure 10 of the present embodiment will be described. As shown in FIG. 2, the method for producing the piezoelectric film layered structure 10 includes a step S1 of preparing the base, a film forming step S2, and an annealing step S3.

In the step S1 of preparing the base, the base 11 is prepared. In the step S1 of preparing the base, the base 11 made of any of the materials described above is prepared.

In the film forming step S2, the ScAlN film 12 is formed on the surface of the base 11. In the film forming step S2, the base 11 is positioned on a film forming device, and the ScAlN film 12 is formed at a predetermined film forming temperature by reactive sputtering method. The film forming temperature corresponds to a first temperature in this disclosure. The unpaired electron density of the ScAlN film 12 after the formation of the ScAlN film 12 and before the annealing is greater than $1.1\times10^{19}$ electrons/cm$^3$.

In the annealing step S3, the ScAlN film 12 is annealed. In the annealing step S3, the ScAlN film 12 is heated at an annealing temperature higher than the film formation temperature. The annealing temperature corresponds to a second temperature in the present disclosure. As a result, the unpaired electron density of the ScAlN film 12 is reduced as compared with that before the annealing. Specifically, the unpaired electron density of the ScAlN film 12 is set to a value within a range between $1.7\times10^{18}$ electrons/cm$^3$, inclusive, and $1.1\times10^{19}$ electrons/cm$^3$, inclusive. Examples of the annealing temperature for setting the unpaired electron density to such value include a temperature that is higher than the film formation temperature by 30° C. or more, or a temperature equal to or higher than 400° C. as will be described later. The annealing temperature may be a temperature lower than the melting points of the base 11 and the ScAlN film 12.

To illustrate an example of the procedure of the annealing step S3, the piezoelectric film layered structure 10 in which the ScAlN film 12 is formed on the surface of the base 11 is moved from the film forming device into the annealing device. Then, the annealing device heats the piezoelectric film layered structure 10 at a predetermined annealing temperature. The piezoelectric film layered structure 10 may be heated inside the film forming device without moving the piezoelectric film layered structure 10 from the film forming device into the annealing device. In this case, after the ScAlN film 12 is formed, the heating temperature of the film forming device is increased from the film forming temperature to the annealing temperature. Alternatively, the heating temperature of the film forming device may be lowered to a value lower than the film forming temperature and then increased to the annealing temperature.

The annealing atmosphere while annealing the ScAlN film 12 is preferably an atmosphere that is inert to ScAlN. Specifically, the annealing atmosphere is preferably an inert gas atmosphere or in a vacuum state. Examples of the inert gas include nitrogen, argon, hydrogen, or a mixed gas thereof.

Here, table 1 shows the measurement results of the electron spin density and tan δ of the piezoelectric film layered structures 10 of samples 1 to 10 prepared by the present inventors. The samples 1 to 10 correspond respectively to sample numbers 1 to 10 in table 1.

TABLE 1

| Sample No. | Annealing temperature (° C.) | Electron spin density (electrons/cm$^3$) | tan δ |
|---|---|---|---|
| 1 | No annealing | $1.4 \times 10^{19}$ | $2.8 \times 10^{-3}$ |
| 2 | 380 | $1.2 \times 10^{19}$ | $1.7 \times 10^{-3}$ |
| 3 | 380 | $1.2 \times 10^{19}$ | $1.2 \times 10^{-3}$ |
| 4 | 400 | $1.1 \times 10^{19}$ | $1.0 \times 10^{-3}$ |
| 5 | 450 | $8.0 \times 10^{18}$ | $8.1 \times 10^{-4}$ |
| 6 | 475 | $3.0 \times 10^{18}$ | $5.4 \times 10^{-4}$ |
| 7 | 500 | $5.0 \times 10^{18}$ | $6.3 \times 10^{-4}$ |
| 8 | 550 | $7.0 \times 10^{18}$ | $6.0 \times 10^{-4}$ |
| 9 | 600 | $1.9 \times 10^{18}$ | $4.3 \times 10^{-4}$ |
| 10 | 800 | $1.7 \times 10^{18}$ | $4.2 \times 10^{-4}$ |

The samples 4 to 10 are prepared using the production method of the present embodiment described above. The sample 1 is a comparative example prepared by a production method in which the annealing step S3 is omitted from the production method of the present embodiment described above. The samples 2 and 3 are comparative examples prepared by a production method in which the conditions of the annealing step S3 are different from that of the production method of the present embodiment described above. The electron spin density was measured by the measuring method described in this embodiment. Tan δ is a value at 1 kHz.

In producing the piezoelectric film layered structures 10 of the samples 1 to 10, the present inventors perform, in the film forming step S2, plasma discharge using a reactive sputtering device to form the ScAlN film 12 on the surface of the silicon substrate as the base 11. The film forming conditions of the ScAlN film 12 at this time are as follows. The Si substrate temperature is the film forming temperature when the ScAlN film 12 is formed.

Target type: ScAl target
Target size: 100 mm in diameter
Distance between silicon substrate and target: 200 mm
DC power: 800 W
Pulse frequency: 20 kHz
Pulse length: 4 μs
Gas flow rate N$_2$: 28 sccm, Ar: 28 sccm
Gas pressure: 0.2 Pa
Si substrate temperature: 370° C.
Specific resistance of Si substrate: $\geq 1 \times 10^3$ Ω·cm The Sc concentration of the ScAl target used for forming the ScAlN film 12 was 40 atomic %. The Sc concentration of the formed ScAlN film 12 was 30 atomic %.

The ScAlN film 12 of the sample 1 was not annealed. In the samples 2 and 3, the ScAlN film was annealed at 380° C. In the samples 4 to 10, the ScAlN film 12 was annealed at a temperature equal to or higher than 400° C. as shown in the table 1.

In the annealing step S3, the present inventor used a quartz tube furnace as the annealing device. The sample was put into the annealing device that is at a standby temperature of 200° C. After that, the internal temperature of the annealing device was increased to a set temperature that is determined such that the temperature of the silicon substrate and the temperature of the ScAlN film 12 are set to the annealing temperature respectively. Then, the set temperature was kept for 60 minutes. Then, the internal temperature of the annealing device was lowered to 200° C. and the sample was removed. In annealing, N$_2$ was used as the atmospheric gas inside the annealing device. The pressure inside the annealing device was set to 80 kPa.

Figure 3:
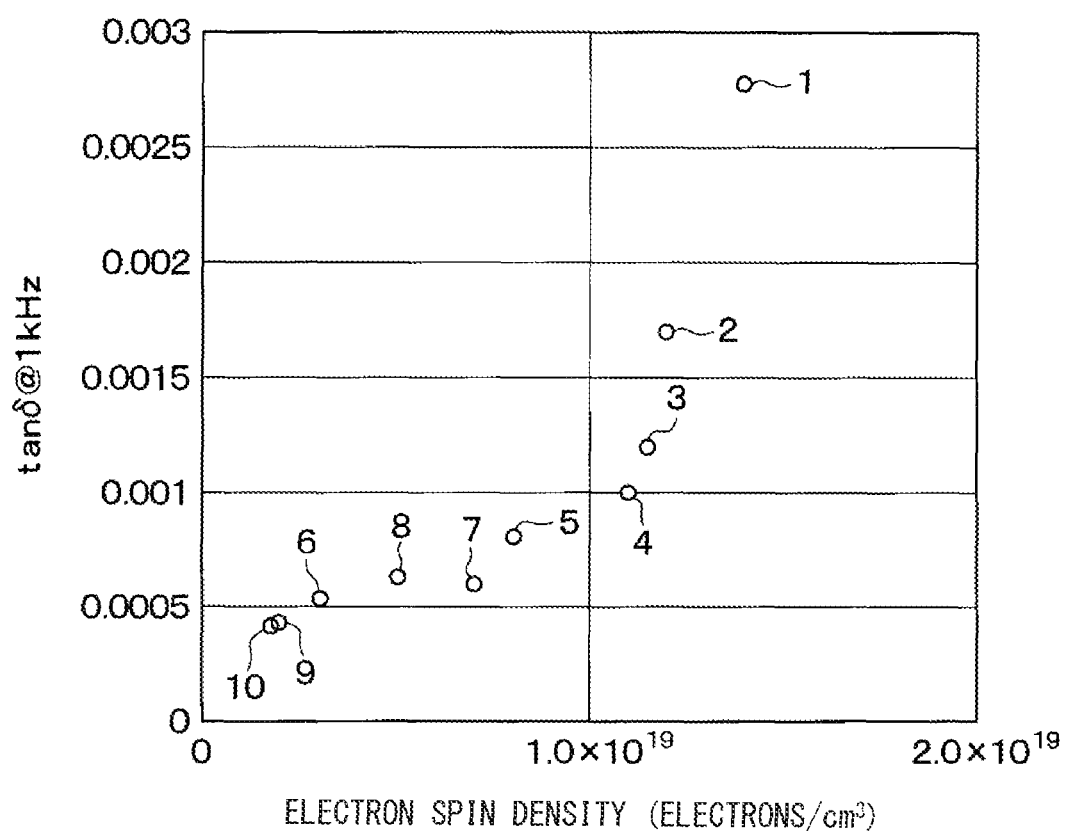
FIG. 3 is a diagram illustrating a relationship between an unpaired electron density and tan δ for piezoelectric film layered structures prepared by the inventors.

FIG. 3 is a graph illustrating the relationship between the tan δ of the ScAlN film 12 and the electron spin density (i.e., the unpaired electron density) of the samples 1 to 10 in the table 1. As shown in FIG. 3, the greater the unpaired electron density is, the greater the tan δ is.

More specifically, a change rate of tan δ is changed at the sample 4 having unpaired density of $1.1 \times 10^{19}$ electrons/cm$^3$ as a boundary. The change rate of tan δ is a ratio of an increase amount of tan δ to an increase amount of unpaired electron density. The change rate of tan δ when the unpaired electron density is within a range between $1.7 \times 10^{18}$ electrons/cm$^3$, inclusive, and $1.1 \times 10^{19}$ electrons/cm$^3$, inclusive, like in the samples 4 to 10 is smaller than the change rate of tan δ when the unpaired electron density is greater than $1.1 \times 10^{19}$ electrons/cm$^3$, like in the samples 1 to 3.

That is, when the unpaired electron density falls within a range between $1.7 \times 10^{18}$, inclusive, and $1.1 \times 10^{19}$, inclusive, like in the samples 4 to 10, tan δ is 0.001 or less. In contrast, when the unpaired electron density is greater than $1.1 \times 10^{19}$ electrons/cm$^3$ like in the samples 1 to 3, tan δ is greater than 0.001. Further, as the unpaired electron density increases, tan δ significantly increases.

Figure 4:
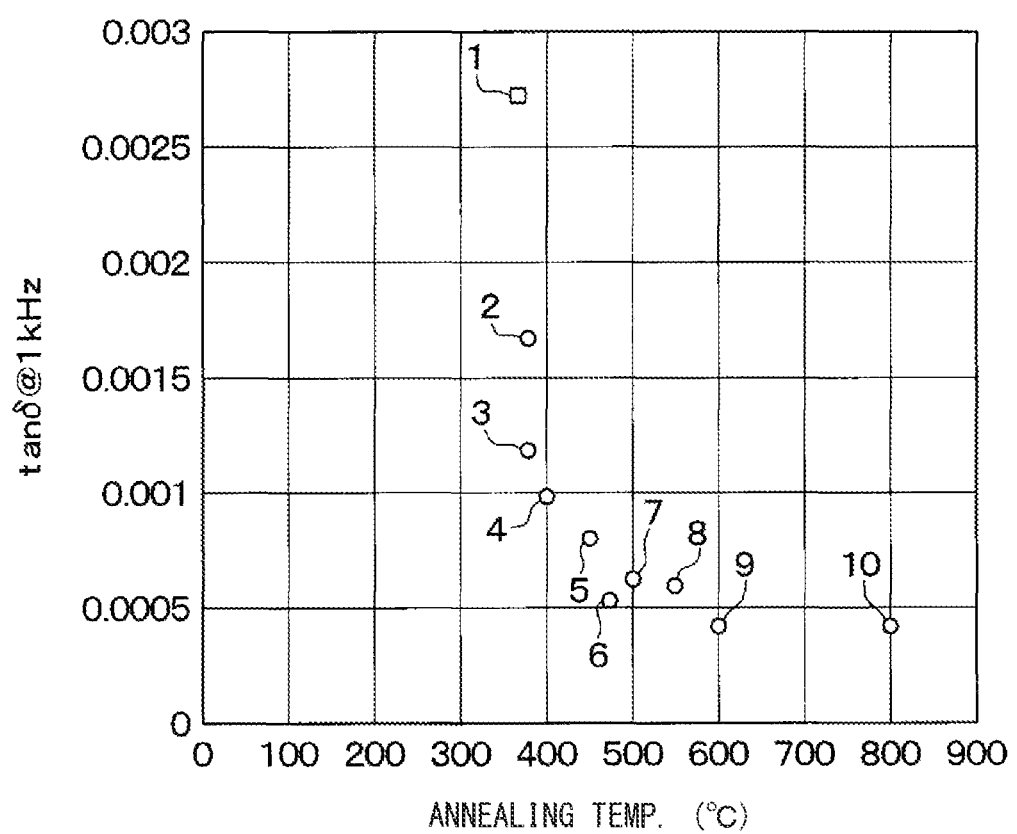
FIG. 4 is a diagram illustrating a relationship between an annealing temperature and tan δ for the piezoelectric film layered structures prepared by the present inventors.

As shown in table 1, the annealing temperature of the samples 4 to 10 falls within a range between 400° C., inclusive, and 800° C., inclusive. FIG. 4 is a graph illustrating a relationship between the tan δ of the ScAlN film 12 and the annealing temperature in the samples 1 to 10 in the table 1. As shown in FIG. 4, when the annealing temperature falls within the range between 400° C., inclusive, and 800° C., inclusive, like in the samples 4 to 10, tan δ is 0.001 or less.

As described above, the present inventors have found that a controlling factor of tan δ of the ScAlN film 12 is the unpaired electron density of the ScAlN film 12. It is considered that the cause of the tan δ of the ScAlN film 12 is the leak current, and the cause of the leak current is a defect in the film, particularly a dangling bond. Therefore, the dangling bond density (that is, the unpaired electron density) is considered to be the controlling factor of tan δ.

The present inventors have found that tan δ can be kept at a low value by setting the unpaired electron density of the ScAlN film 12 to a value within a range between $1.7 \times 10^{18}$ electrons/cm$^3$, inclusive, and $1.1 \times 10^{19}$ electrons/cm$^3$, inclusive. Therefore, according to the piezoelectric film layered structure 10 of the present embodiment, the unpaired electron density of the ScAlN film 12 falls within the range between $1.7 \times 10^{18}$ electrons/cm$^3$, and $1.1 \times 10^{19}$ electrons/cm$^3$. Thus, the tan δ of the ScAlN film 12 can be kept at a low value.

By the way, the following documents discloses that the tan δ of the ScAlN film having the Sc concentration of 30 atomic % or more is higher than 0.001.
JOURNAL OF APPLIED PHYSICS 122, 035301 (2017)
Proc. SPIE 9517, Smart Sensors, Actuators, and MEMS VII; and Cyber Physical Systems, 95171C (21 May 2015)
APL MATERIALS 3, 116102 (2015)
APPLIED PHYSICS LETTERS 97, 112902 2010

In contrast, according to the piezoelectric film layered structure 10 of the present embodiment, the tan δ of the ScAlN film 12 having the Sc concentration within a range between 30 atomic %, inclusive, and 45 atomic %, inclusive, can be equal to or less than 0.001.

Further, the method for producing the piezoelectric film layered structure 10 of the present embodiment includes the step S1 of preparing the base, the film forming step S2, and the annealing step S3. In the annealing step S3, the ScAlN film 12 is heated at the annealing temperature that is higher than the film forming temperature, thereby setting the unpaired electron density of the ScAlN film 12 to be a value within a range between $1.7\times10^{18}$ electrons/cm$^3$, inclusive, and $1.1\times10^{19}$ electrons/cm$^3$, inclusive. According to this, since the unpaired electron density of the ScAlN film 12 falls within a range between $1.7\times10^{18}$ electrons/cm$^3$, inclusive, and $1.1\times10^{19}$ electrons/cm$^3$, inclusive, the piezoelectric film layered structure 10 having low tan δ can be produced.

Here, when ScAlN is a single crystal having no grain boundaries and no crystal defects, there are no unpaired electrons in the ScAlN. In contrast, when ScAlN is a polycrystal having crystal grain boundaries or crystal defects, unpaired electrons are present in the ScAlN. That is, when ScAlN has crystal imperfections, unpaired electrons appear. Annealing the ScAlN film repairs the crystal imperfections of the ScAlN and reduces the unpaired electrons. Because of this, it is considered that the unpaired electron density of the ScAlN film 12 is reduced by annealing.

Further, as shown in table 1, among the samples 1 to 10, the samples 4 to 10 have unpaired electron density of $1.1\times10^{19}$ electrons/cm$^3$ or less. The annealing temperature of the samples 4 to 10 is 400° C. or more. Therefore, in order to reduce the unpaired electron density of the ScAlN film 12 to $1.1\times10^{19}$ electrons/cm$^3$ or less, it is considered that the annealing temperature of 400° C. or more in the annealing step S3 is effective.

The annealing temperature of the samples 4 to 10 is the temperature higher than the film forming temperature by 30° C. or more. Therefore, from another viewpoint, in order to reduce the unpaired electron density of the ScAlN film 12 to $1.1\times10^{19}$ electrons/cm$^3$ or less, it is effective to set the annealing temperature in the annealing step S3 to the temperature higher than the film forming temperature by 30° C. or more.

Second Embodiment

Figure 5:
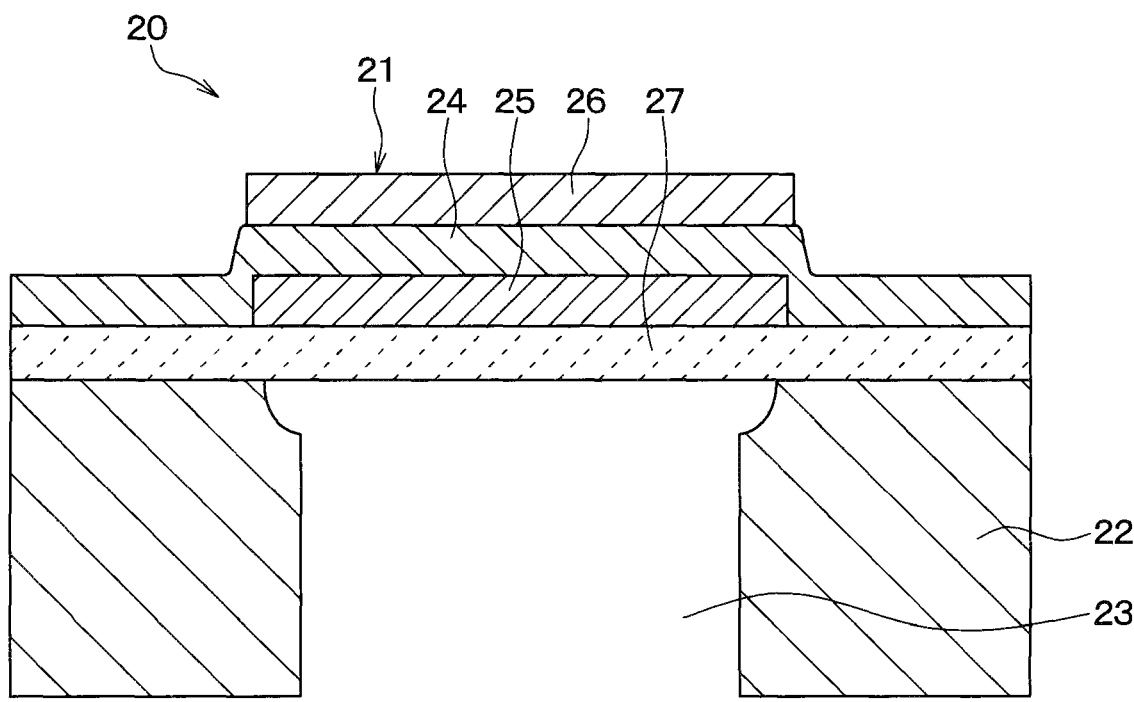
FIG. 5 is a cross-sectional view of a microphone according to a second embodiment.

A microphone 20 of the present embodiment shown in FIG. 5 uses the piezoelectric film layered structure 10 of the first embodiment. The microphone 20 includes a pressure receiving portion 21 and a supporter 22. The pressure receiving portion 21 is a film-like portion that receives sound pressure. The supporter 22 supports the pressure receiving portion 21.

The supporter 22 defines a space 23 into which the pressure receiving portion 21 is deformed by receiving sound pressure. The supporter 22 supports the pressure receiving portion 21 above the space 23 so that the pressure receiving portion 21 can be deformed when the pressure receiving portion 21 receives sound pressure. The supporter 22 is mainly made of silicon.

The pressure receiving portion 21 includes a piezoelectric film 24, a lower electrode 25, an upper electrode 26, and an insulating film 27. The piezoelectric film 24 is the same as the ScAlN film 12 of the first embodiment. The lower electrode 25 is in contact with the lower surface of the piezoelectric film 24. The upper electrode 26 is in contact with the upper surface of the piezoelectric film 24. The lower electrode 25 and the upper electrode 26 are electrodes for recovering electric charge generated in the piezoelectric film 24 when the pressure receiving portion 21 is deformed. The lower electrode 25 and the upper electrode 26 are mainly made of molybdenum (Mo). The insulating film 27 covers the space 23 of the supporter 22 and the peripheral thereof. The insulating film 27 is a silicon oxide film.

The lower electrode 25 is provided on a part of the insulating film 27 located above the space 23. The piezoelectric film 24 is formed on the upper surface of the lower electrode 25 and the surface of a part of the insulating film 27 on which the lower electrode 25 is not formed. Thus, the lower electrode 25 and the insulating film 27 correspond to the base 11 of the first embodiment.

In the microphone 20 configured in this way, when the pressure receiving portion 21 receives sound pressure, the pressure receiving portion 21 deflects. When the pressure receiving portion 21 is deformed into a downward-convex shape, compressive stress is generated in the in-plane direction of the piezoelectric film 24. At this time, an electric charge is generated on the surface of the piezoelectric film 24 due to piezoelectric effect. Further, when the pressure receiving portion 21 is deformed into an upward-convex shape, tensile stress is generated in the in-plane direction of the piezoelectric film 24. At this time, due to piezoelectric effect, an electric charge having the opposite polarity to that when the compressive stress is generated is generated on the surface of the piezoelectric film 24. By recovering the generated electric charge through the lower electrode 25 and the upper electrode 26, the sound pressure applied to the pressure receiving portion 21 can be detected.

According to this embodiment, the ScAlN film 12 of the first embodiment is used as the piezoelectric film 24. As described in the first embodiment, tan δ of the ScAlN film 12 is kept low. Comparing contributions of factors to noises of the microphone, it is known that tan δ contributes the most in the entire frequency range used for the microphone. Thus, noises of the microphone 20 can be reduced.

In this embodiment, the pressure receiving portion 21 includes the insulating film 27. However, the insulating film 27 may be a conductive film different from the lower electrode 25. Further, in the present embodiment, the insulating film 27 is disposed so that the neutral axis in the deflection of the pressure receiving portion 21 does not exist in the piezoelectric film 24. When the neutral axis in the deflection of the pressure receiving portion 21 does not exist in the piezoelectric film 24 by making the lower electrode 25 thicker than the upper electrode 26 or the like, the pressure receiving portion 21 may not include the insulating film 27. Further, in the present embodiment, the piezoelectric film 24, the lower electrode 25, and the upper electrode 26 have the shapes shown in FIG. 5. However, shapes thereof are not limited to the shapes as shown in FIG. 5. Further, each of the lower electrode 25, the upper electrode 26, the supporter 22 and the insulating film 27 may be made of a material different from the above-mentioned materials.

Third Embodiment

Figure 6:
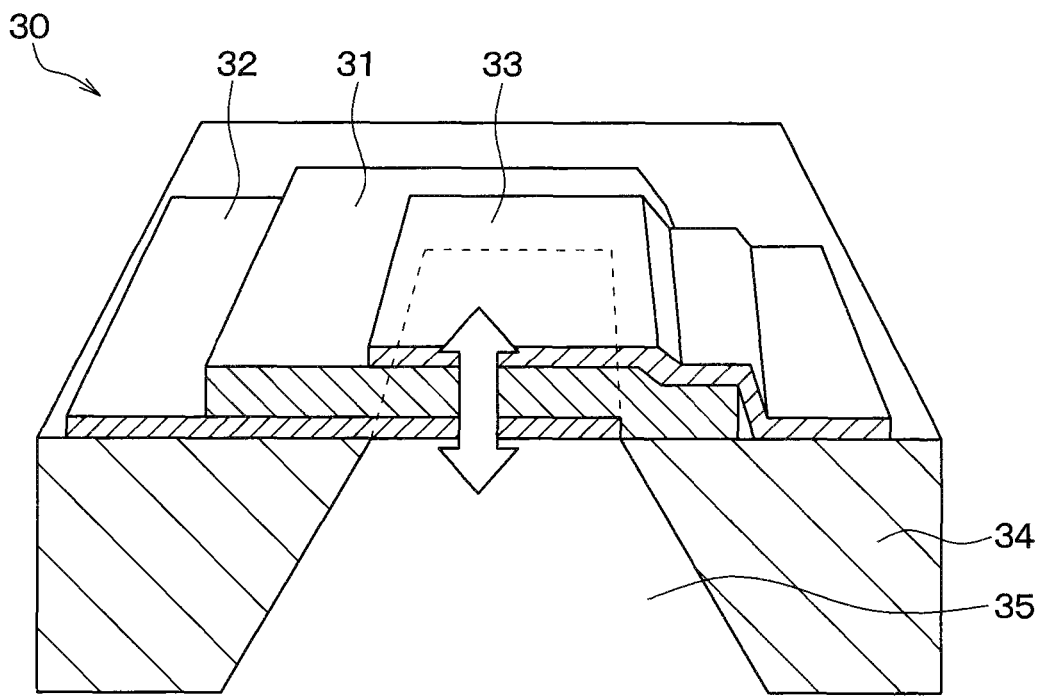
FIG. 6 is a perspective view of a BAW resonator according to a third embodiment.

A BAW resonator 30 of the present embodiment shown in FIG. 6 is a BAW device using the piezoelectric film layered structure 10 of the first embodiment. BAW is an abbreviation for Bulk Acoustic Wave (i.e., a volumetric elastic wave). The BAW resonator 30 includes a piezoelectric film 31, a lower electrode 32, an upper electrode 33, and a supporter 34.

The piezoelectric film 31 is the same as the ScAlN film 12 of the first embodiment. The lower electrode 32 is in contact with the lower surface of the piezoelectric film 31. The upper electrode 33 is in contact with the upper surface of the piezoelectric film 31. The lower electrode 32 and the upper electrode 33 are electrodes that apply AC electric field to the piezoelectric film 31 to vibrate the piezoelectric film 31 in the film thickness direction. The lower electrode 32 and the upper electrode 33 are mainly made of molybdenum (Mo).

The supporter 34 supports the piezoelectric film 31, the lower electrode 32, and the upper electrode 33. The supporter 34 defines a space 35 for the piezoelectric film 31 to vibrate when AC electric field is applied to the piezoelectric film 31. The supporter 34 is mainly made of silicon (Si). The lower electrode 32 faces the space 35 of the supporter 34. In this embodiment, the piezoelectric film 31 is formed on the surface of the lower electrode 32 and on the surface of a part of the supporter 34. Thus, the lower electrode 32 and the supporter 34 correspond to the base 11 of the first embodiment.

In the BAW resonator 30 configured in this way, when voltage is applied between the upper electrode 33 and the lower electrode 32, the piezoelectric film 31 vibrates in the film thickness direction as indicated by the arrow in FIG. 6 due to inverse piezoelectric effect. When a sinusoidal voltage waveform is applied, this stretch vibration also has a sinusoidal vibration waveform. When the frequency of the stretch vibration matches the resonance frequency of the mechanical vibration, the impedance between the upper electrode 33 and the lower electrode 32 changes significantly. As a result, the BAW resonator 30 of the present embodiment becomes an electrical resonator. By using multiple resonators configured as described above and connecting the resonators in a circuit, the filter operation can be realized.

According to this embodiment, the ScAlN film 12 of the first embodiment is used as the piezoelectric film 31. As described in the first embodiment, tan δ of the ScAlN film 12 is kept low. Therefore, the Q value of the resonator can be increased. Thereby, the filter characteristic of the BAW resonator 30 can be improved.

In the BAW resonator 30 of the present embodiment, the supporter 34 defines the space 35. However, the supporter 34 may not define the space 35. In this case, the BAW resonator 30 may include an acoustic multilayer film between the lower electrode 32 and the supporter 34. Further, each of the lower electrode 32, the upper electrode 33 and the supporter 34 may be made of a material different from the above-mentioned materials.

Fourth Embodiment

Figure 7:
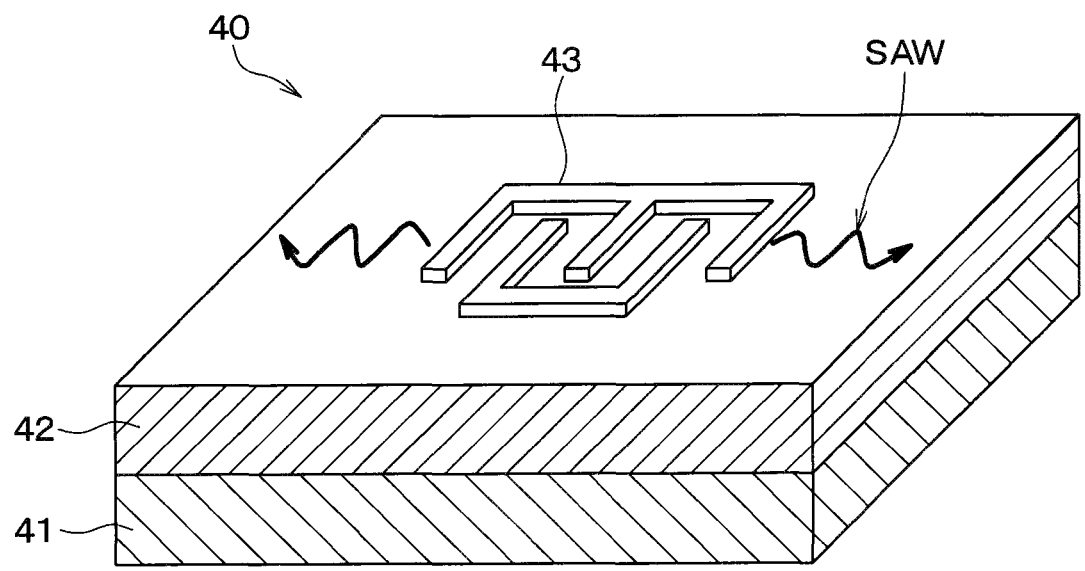
FIG. 7 is a perspective view of a SAW device according to a fourth embodiment.

A SAW device 40 of the present embodiment shown in FIG. 7 uses the piezoelectric film layered structure 10 of the first embodiment. SAW is an abbreviation for Surface Acoustic Wave (i.e., surface elastic wave).

The SAW device 40 includes a substrate 41, a piezoelectric film 42, and a comb tooth electrode 43. The substrate 41 is mainly made of silicon. The substrate 41 corresponds to the base 11 of the first embodiment. The piezoelectric film 42 is the same as the ScAlN film 12 of the first embodiment. The piezoelectric film 42 is provided on the surface of the substrate 41. The comb tooth electrode 43 is provided on the surface of the piezoelectric film 42. The comb tooth electrode 43 excites SAW on the piezoelectric film 42, or receives SAW propagating through the piezoelectric film 42. The comb tooth electrode 43 is mainly made of molybdenum (Mo). Examples of the SAW device 40 includes a SAW resonator, a SAW filter, and the like.

Although not shown, there is a 1-port type SAW resonator as an example of the SAW resonator. In this SAW resonator, reflectors are arranged on both sides of the comb tooth electrode 43 on the surface of the piezoelectric film 42. In this SAW resonator, SAW excited at the comb tooth electrode 43 is reflected at the both reflectors, so that a standing wave is generated. As a result, a resonator is realized. According to this embodiment, the ScAlN film 12 of the first embodiment is used as the piezoelectric film 42. As described in the first embodiment, tan δ of the ScAlN film 12 is kept low. Therefore, the Q value of the SAW resonator can be increased. Thereby, the filter characteristic of the SAW resonator can be improved.

Further, although not shown, another example of the SAW device is a transversal SAW filter. In this SAW filter, the comb tooth electrode 43 includes an input electrode and an output electrode. The SAW excited by the input electrode propagates along the surface of the piezoelectric film 42 and is detected by the output electrode. This makes it possible to extract an electric signal in a specific frequency band. According to this embodiment, the ScAlN film 12 of the first embodiment is used as the piezoelectric film 42. As described in the first embodiment, tan δ of the ScAlN film 12 is kept low. Therefore, the filter characteristics of the SAW filter can be improved.

Each of the substrate 41 and the comb tooth electrode 43 may be made of a material different from the above-mentioned materials.

Fifth Embodiment

Figure 8:
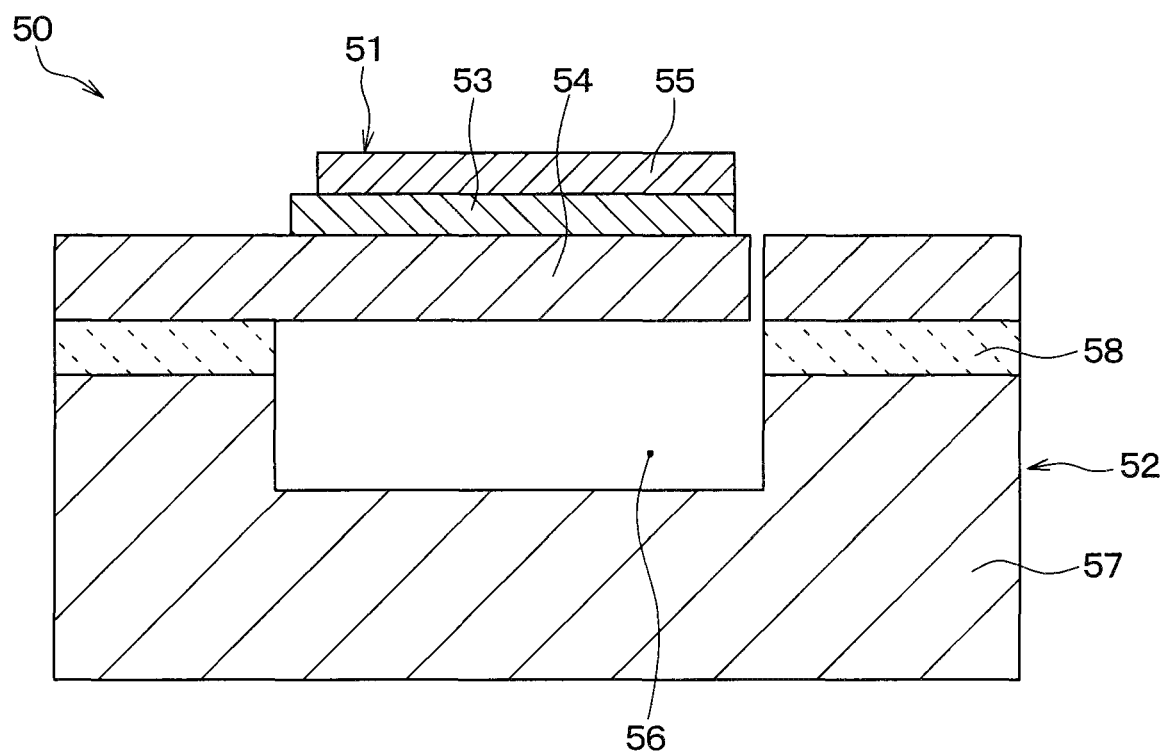
FIG. 8 is a cross-sectional view of a MEMS resonator according to a fifth embodiment.

A MEMS resonator 50 of the present embodiment shown in FIG. 8 uses the piezoelectric film layered structure 10 of the first embodiment. MEMS is an abbreviation for Micro Electro Mechanical Systems.

The MEMS resonator 50 includes a three-layer structure 51 and a supporter 52. The three-layer structure 51 includes a piezoelectric film 53, a lower electrode 54, and an upper electrode 55.

The piezoelectric film 53 is the same as the ScAlN film 12 of the first embodiment. The lower electrode 54 is in contact with the lower surface of the piezoelectric film 53. The upper electrode 55 is in contact with the upper surface of the piezoelectric film 53. The lower electrode 54 and the upper electrode 55 are electrodes that apply AC electric field to the piezoelectric film 53 to expand and contract the piezoelectric film 53 in the in-plane direction of the piezoelectric film 53. The lower electrode 54 and the upper electrode 55 are mainly made of molybdenum. In this embodiment, the piezoelectric film 53 is formed on the surface of the lower electrode 54. Therefore, the lower electrode 54 corresponds to the base 11 of the first embodiment.

The supporter 52 defines a space 56. The supporter 52 supports the three-layer structure 51 such that the three-layer structure 51 can vibrate on the upper side of the space 56. In the present embodiment, one end of the three-layer structure 51 in one direction is fixed to the supporter 52, and the other end of the three-layer structure 51 in the one direction is free. That is, the three-layer structure 51 has a so-called cantilever beam structure. The supporter 52 includes a substrate 57 and an insulating film 58. The substrate 57 is mainly made of silicon (Si). The insulating film 58 is formed on the surface of the substrate 57. The insulating film 58 is a silicon oxide film. The lower electrode 54 is formed on the surface of the insulating film 58.

The thickness of the lower electrode 54 is equal to or greater than the total thickness of the upper electrode 55 and the piezoelectric film 53. Therefore, the neutral axis in the deflection of the three-layer structure 51 exists in the lower electrode 54. When voltage is applied between the upper electrode 55 and the lower electrode 54, the piezoelectric film 53 expands and contracts in the in-plane direction of the film due to inverse piezoelectric effect. Then, the entire of the three-layer structure 51 deflects. When a sinusoidal voltage waveform is applied, this deflection also becomes a sinusoidal vibration. When the frequency of the sinusoidal vibration matches the resonance frequency of the deflection vibration, the impedance between the upper electrode 55 and the lower electrode 54 changes significantly. Thereby, this becomes an electrical resonator. This resonator can be used to generate a reference frequency required for an operation of an arithmetic circuit or the like.

According to this embodiment, the ScAlN film 12 of the first embodiment is used as the piezoelectric film 53. As described in the first embodiment, tan δ of the ScAlN film 12 is kept low. Therefore, the Q value of the resonator can be increased. As a result, the accuracy of the generated reference frequency can be improved.

Each of the lower electrode 54, the upper electrode 55, the substrate 57, and the insulating film 58 may be made of a material different from the above-mentioned materials. Further, if the substrate 57 is an insulator, the insulating film 58 may not be provided.

Other Embodiments (1) In the first embodiment, in the method for producing the piezoelectric film layered structure 10, the unpaired electron density of the ScAlN film 12 is set to a value within a range between $1.7 \times 10^{18}$ electrons/cm$^3$, inclusive, and $1.1 \times 10^{19}$ electrons/cm$^3$, inclusive by performing the annealing step S3 after the film forming step S2. However, if the unpaired electron density of the ScAlN film 12 after film formation can be set to a value within a range between $1.7 \times 10^{18}$ electrons/cm$^3$, inclusive, and $1.1 \times 10^{19}$, inclusive depending on conditions of the film forming step S2 without performing the annealing step S3, the annealing step S3 is not necessary.

(2) The present disclosure is not limited to the foregoing description of the embodiments and can be modified within the scope of the present disclosure, and all such modifications are included within the scope of the disclosure. The above embodiments are not unrelated to each other and can be appropriately combined with each other unless the combination is obviously impossible. Further, in each of the above-mentioned embodiments, it goes without saying that components of the embodiment are not necessarily essential except for a case in which the components are particularly clearly specified as essential components, a case in which the components are clearly considered in principle as essential components, and the like. A quantity, a value, an amount, a range, or the like, if specified in the above-described example embodiments, is not necessarily limited to the specific value, amount, range, or the like unless it is specifically stated that the value, amount, range, or the like is necessarily the specific value, amount, range, or the like, or unless the value, amount, range, or the like is obviously necessary to be the specific value, amount, range, or the like in principle. Further, in each of the embodiments described above, when referring to the material, shape, positional relationship, and the like of the components and the like, except in the case where the components are specifically specified, and in the case where the components are fundamentally limited to a specific material, shape, positional relationship, and the like, the components are not limited to the material, shape, positional relationship, and the like in each of the embodiments.

What is claimed is:

1. A piezoelectric film layered structure, comprising:
   a base; and
   a ScAlN film formed on the base, wherein
   the ScAlN film has an unpaired electron density within a range between $1.7 \times 10^{18}$ electrons/cm$^3$, inclusive, and $1.1 \times 10^{19}$ electrons/cm$^3$, inclusive.

2. The piezoelectric film layered structure according to claim 1, wherein
   a scandium concentration is defined as an atomic percent of scandium that is a proportion of a number of scandium atoms in a total number of the scandium atoms and aluminum atoms, and
   the scandium concentration of the ScAlN film falls within a range between 30 atomic %, inclusive, and 45 atomic %, inclusive.

3. A method for producing a piezoelectric film layered structure, the method comprising:
   forming a ScAlN film on a base at a first temperature; and
   annealing the ScAlN film by heating the ScAlN film at a second temperature higher than the first temperature such that the ScAlN film has an unpaired electron density within a range between $1.7 \times 10^{18}$ electrons/cm$^3$, inclusive, and $1.1 \times 10^{19}$ electrons/cm$^3$, inclusive.

4. The method according to claim 3, wherein
   the second temperature is higher than the first temperature by 30° C. or more.

5. The method according to claim 3, wherein
   the second temperature is equal to or higher than 400° C.

* * * * *